United States Patent
Su et al.

(10) Patent No.: US 6,808,589 B2
(45) Date of Patent: Oct. 26, 2004

(54) WAFER TRANSFER ROBOT HAVING WAFER BLADES EQUIPPED WITH SENSORS

(75) Inventors: Yu-Sheng Su, Tainan (TW); Chiang-Jen Peng, Tainan (TW); Pin-Chia Su, Tainan (TW); Wen-Lang Wu, Tainan (TW)

(73) Assignee: Taiwan Semiconductor Manufacturing Co. Ltd, Hsin Chu (TW)

(*) Notice: Subject to any disclaimer, the term of this patent is extended or adjusted under 35 U.S.C. 154(b) by 89 days.

(21) Appl. No.: 10/171,724

(22) Filed: Jun. 14, 2002

(65) Prior Publication Data

US 2003/0230384 A1 Dec. 18, 2003

(51) Int. Cl.[7] ............................. B68G 68/00; B25J 9/00
(52) U.S. Cl. ........................... 156/345.13; 156/345.51; 118/749; 134/113
(58) Field of Search ........................ 901/46; 134/113; 118/719; 414/935, 936; 156/345.13, 345.22, 345.32, 345.31, 345.51; 294/907

(56) References Cited

U.S. PATENT DOCUMENTS

| | | | | |
|---|---|---|---|---|
| 5,406,092 A | * | 4/1995 | Mokuo | 250/559.4 |
| 6,053,983 A | * | 4/2000 | Saeki et al. | 118/728 |
| 6,275,748 B1 | * | 8/2001 | Bacchi et al. | 700/275 |
| 6,298,280 B1 | * | 10/2001 | Bonora et al. | 700/218 |
| 6,391,113 B1 | * | 5/2002 | Konishi et al. | 118/719 |
| 6,578,891 B1 | * | 6/2003 | Suzuki et al. | 294/64.1 |

FOREIGN PATENT DOCUMENTS

| | | | |
|---|---|---|---|
| JP | 11-176912 | * | 2/1999 |

\* cited by examiner

*Primary Examiner*—Gregory Mills
*Assistant Examiner*—Sylvia R. MacArthur
(74) *Attorney, Agent, or Firm*—Tung & Associates

(57) ABSTRACT

A wafer transfer robot for a wafer processing system, such as a wet bench system, and a method for utilizing the robot. The wafer transfer robot can be constructed by a robot arm that is equipped with a plurality of wafer blades each adapted for picking-up and carrying one of a plurality of wafers. The plurality of wafer blades each has a predetermined thickness, a top surface, a bottom surface and a predetermined spacing from adjacent wafer blades. A plurality of sensors, such as optical sensors, capacitance sensors or magnetic sensors, with at least one mounted on the bottom side of one of the plurality of wafer blades for sensing the presence of metal on a wafer carried on an adjacent wafer blade immediately below the one of the plurality of wafer blades.

10 Claims, 3 Drawing Sheets

WAFER TRANSFER ROBOT HAVING WAFER BLADES EQUIPPED WITH SENSORS

FIELD OF THE INVENTION

The present invention generally relates to an apparatus for transfer wafer from a wafer storage pod to a wafer process machine and more particularly, relates to a wafer transfer robot having a plurality of wafer blades each equipped with a sensing device for sensing the type of wafer it carries.

BACKGROUND OF THE INVENTION

A wet bench process is frequently carried out after a chemical process has been conducted on a semiconductor wafer. When residual chemical must be removed, deionized water rinse is used in a wet bench process for semiconductor wafer processing to perform two major functions of a quick dump rinse (QDR) and a cascade overflow rinse. Conventionally, the two functions are carried out in separate tanks in order to produce the desirable result. One of the major processing issues presented by the conventional dual-tank process is the particle re-deposition problem during a withdrawal step when cassettes are transported from a quick dump rinse tank to a cascade overflow tank. A second major issue is the large floor space required for accommodating the two tanks.

A conventional wet bench wafer cleaning process is shown in FIG. 1. The wet bench wafer cleaning process 10 for cleaning wafer 12 is carried out in six separate cleaning and rinsing tanks sequentially of a HF cleaning tank 14, a first quick dump rinse (QDR) tank 16, a SC-1 cleaning tank 18, a second quick dump rinse tank 20, a SC-2 cleaning tank 22 and a third quick dump rinse tank 24. The first HF cleaning tank is used to hold a diluted HF solution, for instance, at a concentration of 0.5% HF in $H_2O$ for removing a thin native oxide layer from the wafer surface. After the diluted HF cleaning process, the wafer 12 is rinsed in a first quick dump rinse tank 16 with deionized water. Wafer 12 is then cleaned in a second cleaning tank filled with SC-1 cleaning solution, i.e. a mixture of $NH_4OH$, $H_2O_2$ and DI water at a ratio of 1:1:5. The SC-1 cleaning solution is used at a temperature between 70–80° C. for a suitable time period. The wafer 12 is then rinsed again in a second quick dump rinse tank 20 that is filled with DI water. In the final stage of cleaning, the wafer 12 is cleaned in tank 22 filled with a cleaning solution of SC-2 which is a mixture of HCl, $H_2O_2$ and DI water at a ratio of 1:1:6. The wafer 12 is then rinsed in a third quick dump rinse tank 24 with DI water.

The wet bench wafer cleaning process 10 shown in FIG. 1 is conventionally used for pre-diffusion clean, pre-gate oxidation clean, pre-CVD clean, etc. For instance, in the ULSI fabrication of integrated devices, the conventional wet bench wafer cleaning process 10 can be advantageously used for wafer surface cleaning before a coating process in a CVD chamber or an oxidation process in a furnace. The wet bench process shown in FIG. 1 is therefore generally used for front-end processing of a semiconductor wafer.

FIG. 2 is an exploded, perspective view of the conventional wet bench system 10 of FIG. 1 complete with a wafer transfer robot 30. The wafer transfer robot 30 is constructed of a robot arm 32 and a plurality of wafer blades 34 for picking-up wafers stored in a cassette pod 36 (partially shown in FIG. 2). After picking-up wafers from the cassette pod 36, the plurality of wafer blades 34 are turned 90° by the robot arm 32 for delivering the wafers into a wafer storage station 38 for the wet bench system 10. A second robot (not shown) then delivers the wafers into the plurality of liquid tanks 40 shown in FIG. 2 for chemical processing of the wafers. Lifters 42 are used for lowering the wafers into and out of the liquid stored in tanks 40.

FIG. 3 shows a close-up view of the wafer transfer robot 30, the plurality of wafer blades 34 and the robot arm 32. The wafer storage station 38 for the wet bench system 10 is also shown in FIG. 3.

In a semiconductor processing facility, wet bench cleaning or etching is also required for the back-end of processing of wafers. For instance, after the deposition of metal layers in forming various via plugs and interconnects. In the wet bench system used in cleaning the back-end wafers, there are always metal particles or metal ions present in the chemical tanks which are absent in the chemical tanks used in cleaning front-end wafers. Since the wet bench cleaning stations are normally grouped together in a semiconductor fabrication facility, i.e for ease of control of chemical dispensing and disposal of used chemicals, the wet bench process lines used for the front-end processing and for the back-end processing must be clearly distinguished. When a batch of wafers intended for front-end wet bench process is mistakenly loaded into a wet bench station used for back-end process, serious contamination of the wafers by metal ions or particles can result in the scrap of the entire lot of wafers. The cost of such mistake is extremely high and can be detrimental to the throughput of an IC device.

Conversely, when a batch of wafers intended for back-end wet bench process is mistakenly placed in a wet bench station for front-end process, the metal layers present on the wafers contaminates the chemical tanks which is very costly and time consuming to clean and replace such that they can be used for processing front-end wafers.

It is therefore an object of the present invention to provide an apparatus for transferring wafers into a wet bench station that does not have the drawbacks or shortcomings of the conventional transfer apparatus.

It is another object of the present invention to provide a wafer transfer robot for a wafer processing system capable of identifying the type of wafer it carries.

It is a further object of the present invention to provide a wafer transfer robot for a wafer processing system that is equipped with wafer blades capable of identifying the type of wafer carried on the blade.

It is another further object of the present invention to provide a wafer transfer robot equipped with a plurality of wafer blades wherein each of the blades is equipped with a sensing device.

It is still another object of the present invention to provide a wafer transfer robot equipped with a plurality of wafer blades each adapted for picking-up a wafer and identifying the wafer as a front-end processed wafer or a back-end processed wafer.

It is yet another object of the present invention to provide a wafer transfer robot equipped with a plurality of wafer blades each equipped with a sensing means capable of sensing whether a wafer it carries has metal layers on top.

SUMMARY OF THE INVENTION

In accordance with the present invention, a wafer transfer robot equipped with a plurality of wafer blades each equipped with a sensing device and a method for using the wafer transfer robot are disclosed.

In a preferred embodiment, a wafer transfer robot for a wafer processing system is provided which includes a robot arm equipped with a plurality of wafer blades each adapted for picking-up and carrying one of a plurality of wafers; the plurality of wafer blades each having a predetermined thickness, a top surface, a bottom surface and a predetermined spacing from adjacent robot blades; and a plurality of sensors with at least one mounted on the bottom surface of one of the plurality of wafer blades for sensing the presence of metal on a wafer carried on an adjacent wafer blade immediately below the one of the plurality of wafer blades.

In the wafer transfer robot for a wafer processing system, the wafer processing system may be a wet bench station. The plurality of wafer blades are formed of a metal that does not generate contaminating particles, or formed of aluminum. The predetermined spacing from adjacent wafer blades is between about 3 mm and about 15 mm, and preferably between about 7 mm and about 12 mm. The plurality of sensors are optical sensors for sensing a reflectance of light from a top surface of a wafer that is positioned immediately below the one of the wafer blades. The plurality of sensors may be capacitance sensors for sensing the presence of metal on a top surface of a wafer that is positioned immediately below the one of the wafer blades. The plurality of sensors may also be magnetic sensors. The wafer processing system may be a wet bench for front-end processing of wafers that do not contain any metal layers.

The present invention is further directed to a method for transferring a wafer into a wet bench processing system which can be carried out by the operating steps of first providing a wafer transfer robot that includes a robot arm equipped with a plurality of wafer blades each adapted for picking-up and carrying one of a plurality of wafers; the plurality of wafer blades each has a predetermined thickness, a top surface, a bottom surface and a predetermined spacing from adjacent wafer blades; a plurality of sensors with at least one mounted on the bottom surface of one of the plurality of wafer blades; picking-up at least one wafer by the wafer transport robot from a wafer storage pod; sensing by the at least one sensor a presence of metal on a top surface of a wafer carried on an adjacent wafer blade immediately below the one of the plurality of wafer blades; and signaling an alarm and stopping the wet bench process.

The method for transferring a wafer into a wet bench processing system may further include the step of providing the plurality of sensors in optical sensors, or in capacitance sensors. The method may further include the step of providing the robot arm and the plurality of wafer blades in a metal that does not generate contaminating particles during operation. The present invention is still further directed to a wet bench system for processing semiconductor wafers which includes a first wafer transfer robot that has a robot arm equipped with a plurality of wafer blades each adapted for picking-up and carrying one of a plurality of wafers; the plurality of wafer blades each has a predetermined thickness, a top surface, a bottom surface and a predetermined spacing from adjacent wafer blades; a plurality of sensors with at least one mounted on the bottom surface of one of the plurality of wafer blades for sensing the presence of metal on a wafer carried on an adjacent wafer blade immediately below the one of the plurality of wafer blades; a plurality of liquid tanks for holding quantities of etchants and rinse solutions; and a second wafer transfer robot for removing the wafers from the wet bench system.

In the wet bench system for processing semiconductor wafers, the predetermined spacing from adjacent wafer blades is between about 3 mm and about 15 mm, and preferably between about 7 mm and about 12 mm. The plurality of sensors may be optical sensors, or magnetic sensors for sensing the presence of metal from a top surface of a wafer positioned immediately below the wafer blade. The wet bench system may be a wet bench for front-end processing of wafers that do not contain any metal layers.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a wafer transfer robot for a wafer processing system which includes a robot arm equipped with a plurality of wafer blades, and a plurality of sensors with at least one mounted on the bottom surface of each of the wafer blades.

The plurality of wafer blades in the robot arm each is adapted for picking-up and carrying one of the plurality of wafers. Each of the plurality of wafer blades has a predetermined thickness, a top surface, a bottom surface and are situated at a predetermined spacing from adjacent wafer blades. The plurality of sensors are mounted with one on each of the bottom surface of the plurality of wafer blades for sensing the presence of metal on a wafer surface that is carried on an adjacent wafer blade immediately below the one of the plurality of wafer blades.

A suitable predetermined spacing between the adjacent wafer blades is between about 3 mm and about 5 mm, and preferably between about 7 mm and about 12 mm. The word "about" used in this writing indicates a range of values that is ±10% of the average value given.

The plurality of sensors should be thin enough such that they can be mounted on the bottom surface of the wafer blades without protruding significantly from the blades. For instance, the sensors should have a thickness of less than 3 mm, and preferably thinner. A suitable sensor may be of the optical type capable of sensing a reflectance of light from an adjacent surface. The sensor may also be a capacitance sensor for sensing the capacitance of a surface that is situated adjacent to the sensor. The sensor may further be provided in a magnetic sensor for sensing the present of metal layers, such as copper.

Figure 1:
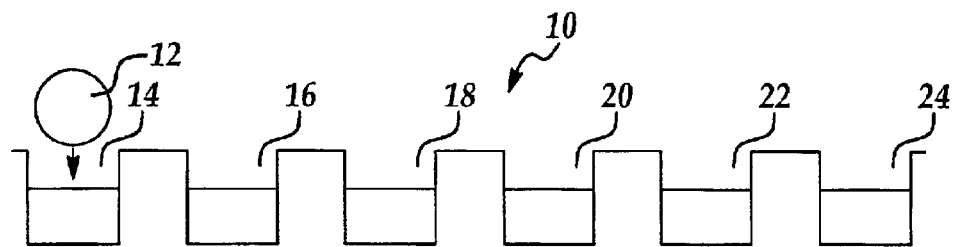
FIG. 1 is an illustration of a conventional wet bench system including a plurality of liquid tanks.
Figure 2:
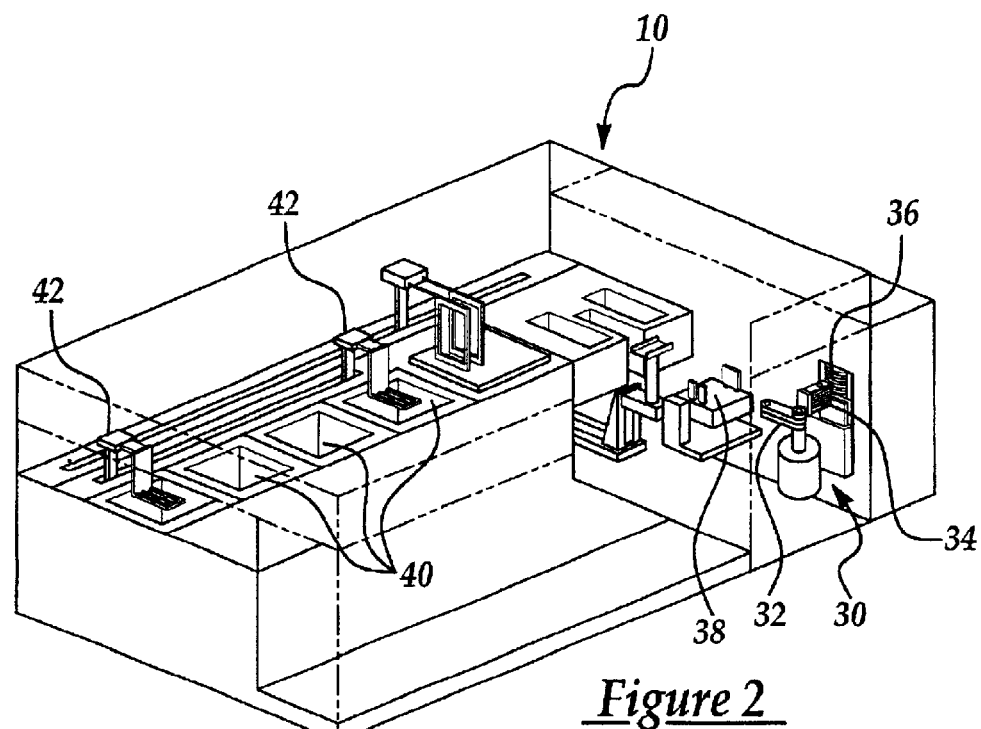
FIG. 2 is an exploded, perspective view of a conventional wet bench system.
Figure 3:
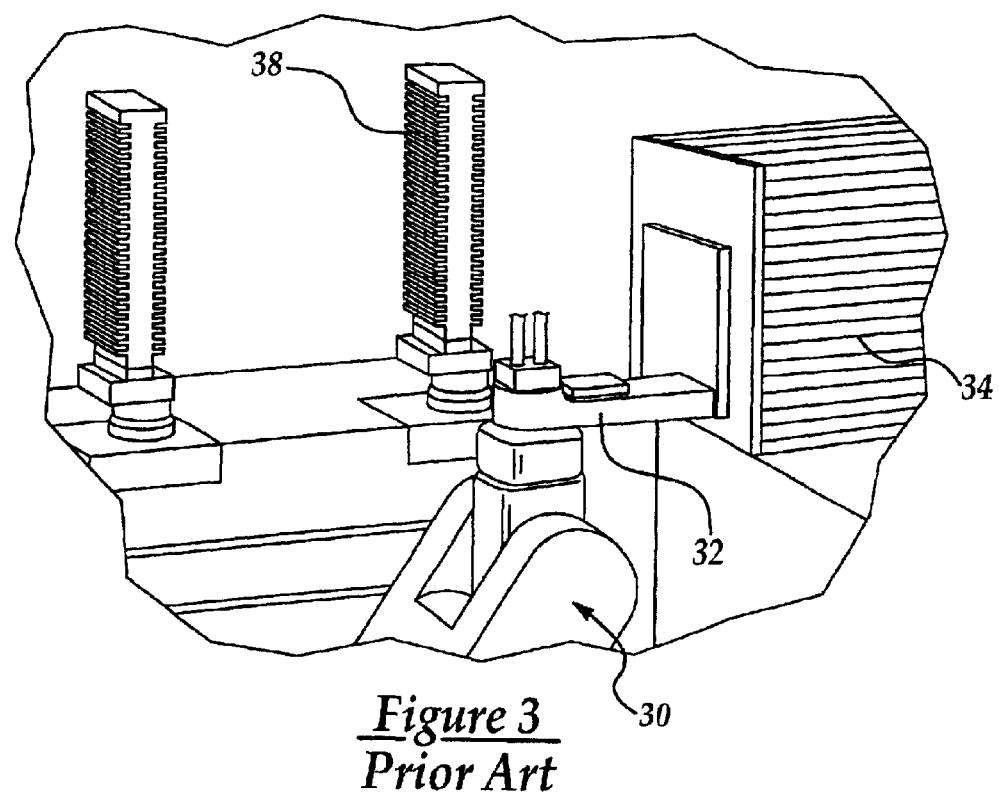
FIG. 3 is a perspective view of a conventional wafer transfer robot for a wet bench system.
Figure 4:
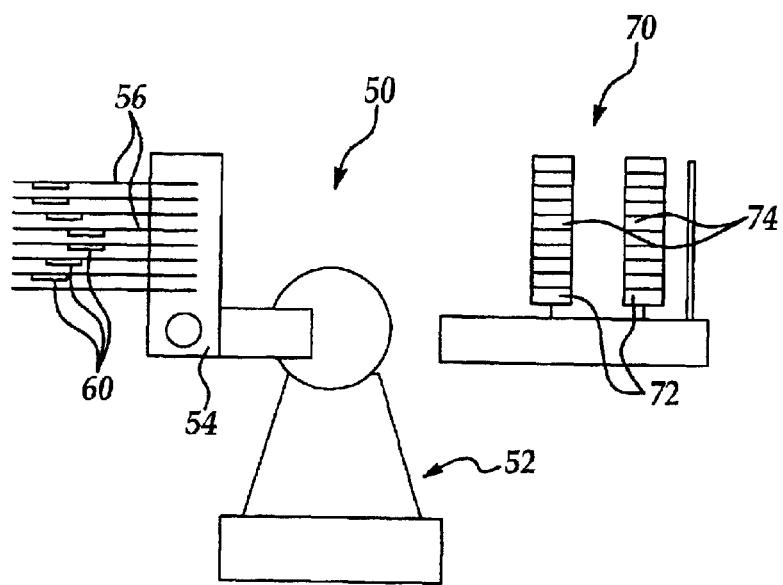
FIG. 4 is a side view of the present invention wafer transfer robot having wafer blades equipped with sensor means.

Referring now to FIG. 4, wherein a present invention wafer transfer robot 50 is shown. The wafer transfer robot 50 is constructed of a base portion 52, a robot arm 54 and a plurality of wafer blades 56. On the bottom of each of the plurality of wafer blades 56, is mounted a sensor 60 which may be of the optical type, the capacitance sensor type, or the magnetic sensor type. In the preferred embodiment of the present invention, optical sensors 60 were utilized for sensing the light reflected from a top surface of a wafer that is positioned under the sensor. Since one of the key objectives of the present invention method is to detect and distinguish wafers in the front-end process and in the back-end process, the detection of a metal layer on top of a wafer surface is of the utmost importance. When a top surface of a wafer is covered by a metal layer, the light reflectance from the wafer surface is significantly increased when compared to a top surface that is silicon oxide, or other dielectric materials. A large increase in the light reflectance can be easily picked-up by an optical sensor.

The optical sensors 60, shown in FIG. 4, should be provided in a small thickness, i.e. preferably less than 3 mm thick such that no significant mount of space is occupied under the wafer blade 56. Since the between-the-wafer-blade distance is about 1 cm in a typical, commercial robot transfer system, there is plenty of room for installing the sensors while still having sufficient room for operating the wafer blade 56.

A wafer receiving station 70 for the wet bench system 10 is also shown in FIG. 4. The wafer receiving station 70 consists of two support structures 72 each provided with a plurality of slot openings 74 for accepting a wafer therein between. As shown in FIG. 4, the slot opening 74 is not occupied by any wafers, prior to the delivery of wafers by the robot transfer system 50.

Figure 5:
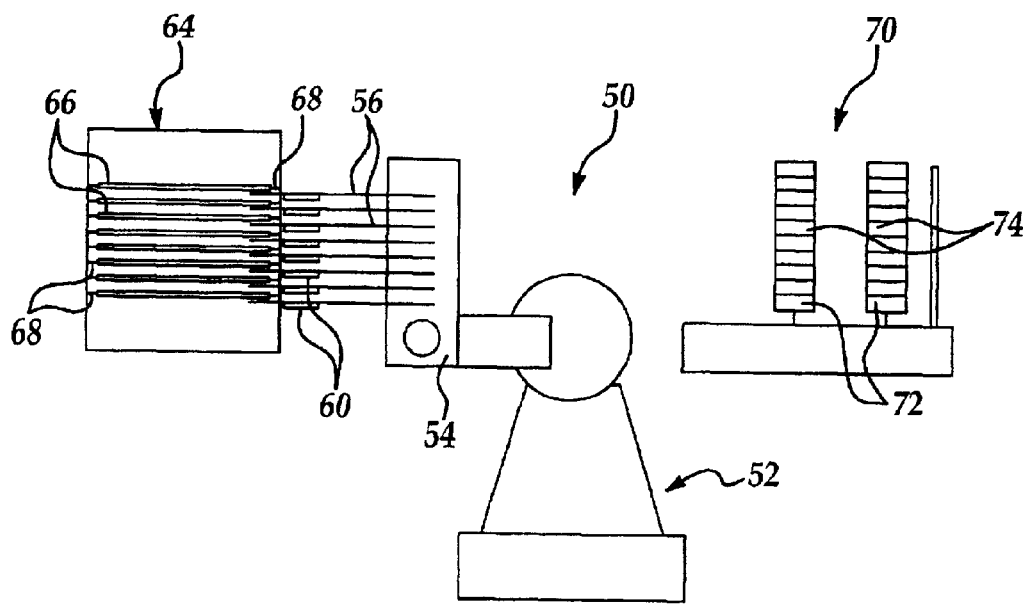
FIG. 5 is a side view of the present invention wafer transfer robot of FIG. 4 in the process of picking-up wafers from a wafer storage pod.

FIG. 5 illustrates the present invention robot transfer system 50 in the process of picking up wafers 66 from a cassette pod 64. The cassette pod 64, in the case of a pod for holding 12" wafers, may be a FOUP (front opened unified pod). The robot arm 54 extends itself into the cavity of the cassette pod 64 such that each of the plurality of wafer blades 56 is positioned directly under a wafer 66. The robot arm 54 then raises itself slightly to lift the wafers 66 from their slot openings 68 and withdraws from the cavity of the cassette pod 64. This step is not shown in FIG. 5.

It should be noted that, after wafers 66 are picked-up by the wafer blades 56, a determination is made by the sensors 60 to identify or distinguish the wafer 66 and determine whether it is a front-end processed or a back-end processed wafer. For instance, when optical sensors 60 are utilized, the light reflectance from the top surface of the wafers 66 provides a ready identification of the wafer surface of a metal layer or a non-metal layer.

Figure 6:
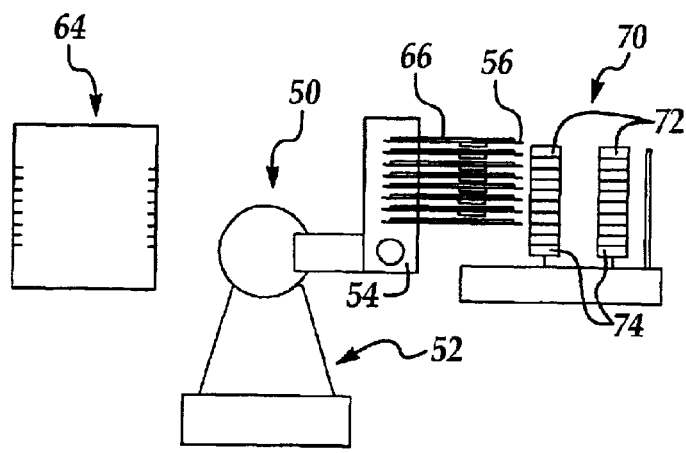
FIG. 6 is a side view of the present invention wafer transfer robot of FIG. 5 in the process of delivering a plurality of wafers into a wet bench station.
Figure 6A:
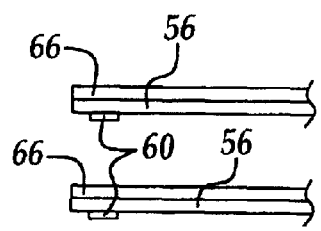
FIG. 6A is a partial, cross-sectional view of two of the wafer transfer blades equipped with sensor means of the present invention.

A partial, enlarged, cross-sectional view of the wafer blade 56 and the wafer 66 it carried on top is shown in FIG. 6A.

In the next step of the process, the wafer transfer robot 50 rotates, approximately between 90° and 180°, to a position directed to the wafer receiving station 70 of the wet bench 10. The robot arm 54 extends itself such that the wafer blades 56, together with the wafers 66, are positioned inside the receiving station 70 in-between the slot openings 74. After the robot arm 54 lowers its position slightly such that wafers 66 are supported by the slot openings 74, the robot arm 54, together with the wafer blades 56, withdraws out of the wafer receiving station 70.

After the wafer type is determined and identified by the sensor 60, as shown in FIG. 5, if the wrong type of wafer 66 is picked-up, an alarm signal will be activated to alert the machine operator and to stop the wet bench process. For instance, in a wet bench system used to process front-end semiconductor wafers, if a metal layer is detected by the optical sensor 60 by the light reflectance from the wafer surface, the machine operator is alerted to stop the transferring of wafers into the wafer receiving station 70 of the wet bench system.

The present invention novel wafer transfer robot that has wafer blades equipped with sensors and a method for using the wafer transfer robot have therefore been amply described in the above description and in the appended drawings of FIGS. 4–6A.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer transfer robot for a wafer processing system comprising:

a robot arm equipped with a plurality of wafer blades each adapted for picking up and carrying one of a plurality of wafers;

said plurality of wafer blades each having a predetermined thickness, a top surface, a bottom surface and a predetermined spacing from adjacent wafer blades; and a plurality of sensing means with at least one mounted on the bottom surface of one of said plurality of wafer blades for sensing the presence of metal on a wafer carried on an adjacent wafer blade immediately below said one of the plurality of wafer blades.

2. A wafer transfer robot for a wafer processing system according to claim 1, wherein said wafer processing system is a wafer wet bench.

3. A wafer transfer robot for a wafer processing system according to claim 1, wherein said plurality of wafer blades are formed of a metal that does not generate contaminating particles.

4. A wafer transfer robot for a wafer processing system according to claim 1, wherein said plurality of wafer blades are formed of aluminum.

5. A wafer transfer robot for a wafer processing system according to claim 1, wherein said predetermined spacing from adjacent wafer blades is between about 3 mm and about 15 mm.

6. A wafer transfer robot for a wafer processing system according to claim 1, wherein said predetermined spacing from adjacent wafer blades is preferably between about 7 mm and about 12 mm.

7. A wafer transfer robot for a wafer processing system according to claim 1, wherein said plurality of sensing means are optical sensors for sensing a reflectance of light from a top surface of a wafer that is positioned immediately below said one of the wafer blades.

8. A wafer transfer robot for a wafer processing system according to claim 1, wherein said plurality of sensing means are capacitance sensors for sensing the presence of metal on a top surface of a wafer that is positioned immediately below said one of the wafer blades.

9. A wafer transfer robot for a wafer processing system according to claim 1, wherein said plurality of sensing means are magnetic sensors for sensing the presence of metal on a top surface of a wafer that is positioned immediately below said one of the wafer blades.

10. A wafer transfer robot for a wafer processing system according to claim 1, wherein said wafer processing system is a wet bench for front-end processing of wafers that do not contain any metal layers.

* * * * *